United States Patent [19]

Sadamori

[11] Patent Number: 5,113,992

[45] Date of Patent: May 19, 1992

[54] VERTICAL WAFER CARRYING APPARATUS

[75] Inventor: Masaaki Sadamori, Fukuoka, Japan

[73] Assignee: Mitsubishi Denki Kabushiki Kaisha, Japan

[21] Appl. No.: 585,979

[22] Filed: Sep. 20, 1990

[30] Foreign Application Priority Data

Sep. 21, 1989 [JP] Japan .................. 1-243417

[51] Int. Cl.⁵ .............................................. B65G 1/12
[52] U.S. Cl. .......................... 198/347.3; 198/347.1; 198/607
[58] Field of Search ............ 198/347.1, 347.2, 347.3, 198/347.4, 444, 460, 604, 607, 626.1, 817

[56] References Cited

U.S. PATENT DOCUMENTS

| | | | |
|---|---|---|---|
| 3,105,334 | 10/1963 | Marshall | 198/604 X |
| 3,124,231 | 3/1964 | Ott, Jr. | 198/604 X |
| 3,754,632 | 8/1973 | Kreutter | 198/347.3 |
| 4,116,117 | 9/1978 | Bogaard | 198/607 X |
| 4,170,285 | 10/1979 | Hinchcliffe | 198/347.3 |
| 4,220,236 | 9/1980 | Blidung et al. | 198/347.3 |
| 4,502,587 | 3/1985 | Clark | 198/347.1 |

FOREIGN PATENT DOCUMENTS

| | | | |
|---|---|---|---|
| 2040879 | 2/1972 | Fed. Rep. of Germany | 198/607 |
| 57121140 | 1/1956 | Japan . | |
| 63-139811 | 6/1988 | Japan . | |
| 0834957 | 5/1981 | U.S.S.R. | 198/626.1 |
| 2061216 | 5/1981 | United Kingdom | 198/347.3 |

OTHER PUBLICATIONS

IBM Technical Disclosure Bulletin, "Wafer Buffer", Hanscom, Leverett, & Lockhart, Apr. 1976, vol. 18 No. 11.

Primary Examiner—Joseph E. Valenza
Assistant Examiner—James R. Bidwell
Attorney, Agent, or Firm—Leydig, Voit & Mayer

[57] ABSTRACT

An apparatus for vertically carrying semiconductor wafers includes a pair of flexible endless belts, each having projections for forming horizontal, parallel shelves. The endless belts are supported by a support unit and are movable along endless loops. The endless belts are disposed with their shelves facing each other to define a vertical transfer path having an entrance and an exit. A drive unit drives the endless belts along the endless loops at equal speeds in the same direction within the vertical transfer path. The wafer carrying apparatus also comprises an entrance conveying unit disposed close to the entrance of the vertical transfer path for conveying a semiconductor wafer to the entrance and an exit conveying unit disposed close to the exit of the vertical transfer path for conveying a semiconductor wafer from the exit. The entrance and exit of the apparatus can be altered as desired by changing the operational modes of the endless belts and the conveying units.

5 Claims, 3 Drawing Sheets

FIG. I
PRIOR ART

VERTICAL WAFER CARRYING APPARATUS

BACKGROUND OF THE INVENTION

This invention relates to a vertical wafer carrying apparatus and, more particularly to an apparatus for carrying semiconductor wafer in vertical direction in a process for manufacturing semiconductor devices.

In order to improve productivity of semiconductor elements, the diameter of semiconductor wafers has been increased to reach and now is exceeding about 20 cm to about 25 cm. Therefore, the conventional batch type manufacturing process is being rapidly replaced with the single piece flow type employing a conveyor belt and an air bearing.

FIG. 1 illustrates in a perspective view an ordinary air bearing conveyor line for photo-engraving, in which semiconductor wafers 2 successively supplied from a wafer supply cassette 1 are conveyed by air bearings 3 in the direction of the arrows, whereby they are processed at various process stages. In FIG. 1, the photo-engraving is achieved by conveying the semiconductor wafers 2 through a photo-resist coating chamber 4, a prebaking zone 5, a pattern printing machine 6, developing chamber 7, a post baking zone 8, a resist inspector 9, a photo-etching chamber 10, a photo-resist removal chamber 11, a dewatering baking zone 12 and a pattern inspector 13 to a wafer containing cassette 14.

The semiconductor wafer carrying method as above described is satisfactory when the wafers are conveyed in one direction and the same treatments are applied to each wafer. However, it has recently become increasingly necessary that various wafers having different patterns since the demands of customers are mixed and conveyed by a single common conveyer line in making Application Specific ICS (ASICS). For a semiconductor device manufacturing line, changing the arrangement of the line according to the demand of the customer must be avoided because it causes a loss and the line must be automated and dust-free.

For example, in the manufacturing line illustrated in FIG. 1, when a wafer which does not need certain of the illustrated processing chambers, the line management is extremely difficult. Also, when the sampling check for the wafer quality, temporary waiting or wafer storing is necessary, the entire line must be stopped. Further, it is desirable to make such temporary halt or branching of the line possible within a limited space as small as possible.

SUMMARY OF THE INVENTION

Accordingly, one object of the present invention is to provide a vertical wafer carrying apparatus which can convey semiconductor wafers in the vertical direction.

Another object of the present invention is to provide an apparatus for carrying semiconductor wafers in the vertical direction which increases the degree of freedom in the design or the arrangement of a semiconductor wafer manufacturing line.

Another object of the present invention is to provide an apparatus for carrying semiconductor wafers in the vertical direction which enables, when used in a process line for manufacturing semiconductor devices, wafer temporary storge, line branching, process jumping, etc.

Still another object of the present invention is to provide an apparatus for carrying semiconductor wafers in the vertical direction which enables wafer temporary storage, line branching, process jumping, etc. in a process line for manufacturing semiconductor devices within a limited space.

With the above objects in view, the vertical wafer carrying apparatus of the present invention comprises a pair of endless elastic belts each having a plurality of substantially horizontal, parallel shelves. The endless belts are supported by a support mechanism in spaced, parallel endless loops, in which the endless belts are movable therealong. The belts are disposed with their shelves facing each other to define a substantially vertical transfer path having an entrance and an exit therebetween, the endless belts being movable along the endless loops. Also included is a drive unit for driving the endless belts along the endless loops at substantially equal speeds in the same direction within said vertical transfer path. The vertical wafer conveyor also comprises an entrance conveying unit disposed in the vicinity of the entrance of the vertical tranfer path for conveying the semiconductor wafers to the entrance, and an exit conveying unit disposed in the vicinity of the exit of the vertical tranfer path for conveying the semiconductor wafers from the exit.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
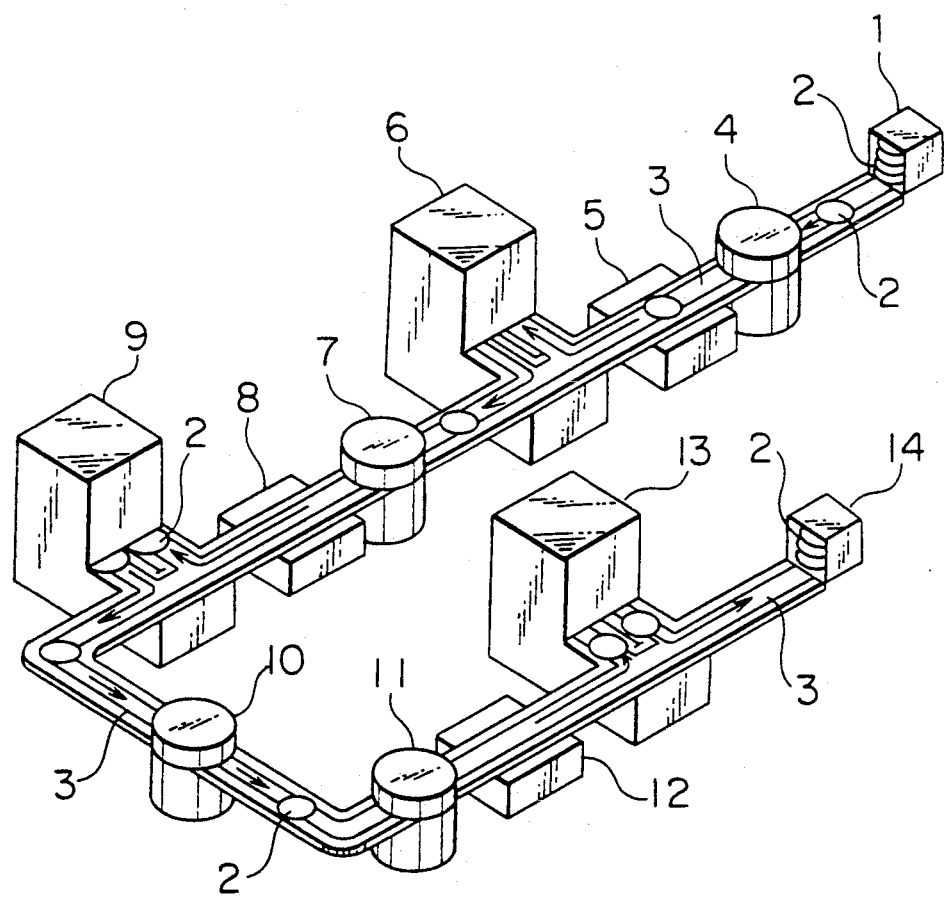
FIG. 1 is a perspective view of a conventional semiconductor manufacturing process line.
Figure 2:
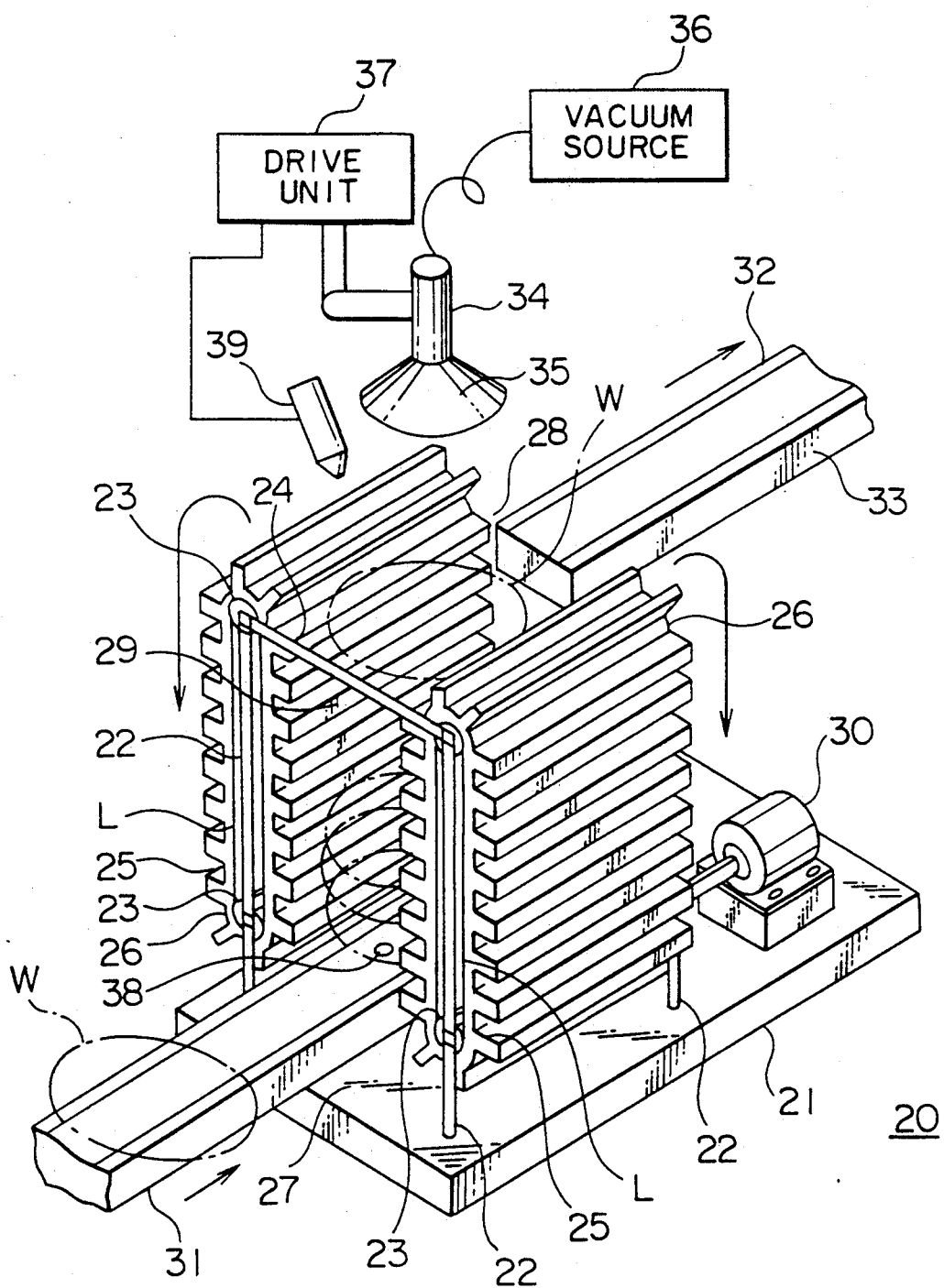
FIG. 2 is a prespective view illustrating one emobodiment of an apparatus according to the invention for vertically carrying semiconductor wafers.

A vertical wafer carrying apparatus 20 of the present invention comprises a support unit 24 including a base 21, four support posts 22 secured to the base 21 and four roller-shaped pulleys 23 rotatably mounted to the support posts 22. The pulleys 23 of the support unit 24 support a pair of endless belts 26 each having a plurality of substantially horizontal, parallel shelves 25. The endless belts 26 may be made of a suitable flexible material such as soft plastic and rubber. The support unit 24 supports the pair of endless belts 26 in spaced, parallel endless loops L along which the endless belts 26 are movable. The endless belts 26 are disposed on the support unit 24 such that their shelves 25 on one endless belt 26 face the shelves 25 on the other endless belt 26 to define a substantially vertical transfer path 29 therebetween. The vertical transfer path 29 has an entrance and an exit at its opposite ends, and the opposing shelves 25 within the transfer path 29 support semiconductor wafers W at their peripheral edges. In the illustrated embodiment, the semiconductor wafers W are upwardly conveyed along the transfer path 29 and the vertical transfer path 29 has an entrance 27 at its bottom end and an exit 28 at its upper end.

The vertical wafer conveyor apparatus 20 also comprises a drive unit 30 for driving the endless belts 26 along the endless loops L at substantially equal speed in the same direction within the vertical transfer path 29. The drive unit 30 is mounted on the base 21 and comprises a pair of stepping motors connected to the pulleys 23 for driving them in the opposite directions.

The vertical wafer conveyor apparatus 20 further comprises an entrance conveying unit 31 disposed in the vicinity of the entrance 27 of the vertical transfer path 29 for conveying the semiconductor wafer W to the entrance 27, and an exit conveying unit 32 disposed in the vicinity of the exit 28 of the vertical transfer path 29 for conveying the semiconductor wafer W from the exit 28. In the illustrated embodiment, the entrance conveying unit 31 is an air bearing conveyor having its front end inserted into the entrance 27 of the vertical transfer path 29 defined between the endless belts 26 in such a relationship that the diametrically opposite peripheral edges of the semiconductor wafers W conveyed along the air bearing conveyor 31 are positioned above the opposing shelves 25 of the facing endless belts 26. An air bearing conveyor is a known conveyor device for conveying an article on an air flow layer generated by a number of nozzles arranged along a line and tilted in the direction of extension of the line.

The exit conveying unit 32 in the illustrated form comprises an air bearing conveyor 33 having its end disposed adjacent to the exit 28 of the vertical transfer path 29 defined between the endless belts 26 and a transfer unit 34 for transferring the semiconductor wafer W between the exit 28 and the air bearing conveyor 33. The transfer unit 34 comprises a suction pad 35, a vacuum source 36 connected to the suction pad 35 and a drive unit 37 for moving the suction pad 35. The suction pad 35 may be replaced with any other suitable pick-up means such as electrostatic chuck, a mechanical chuck, Bernoulli chuck, etc.

With the apparatus for vertically conveying semiconductor wafers as above constructed, the semiconductor wafer W conveyed by the air bearing conveyor 31 from an unillustrated supply source is inserted into the entrance 27 of the vertical transfer path 29 defined between the endless belts 26 so that each of the diametrically opposite side edges along the direction of extension of the air bearing conveyor 31 are inserted between two vertically separated, adjacent shelves 25 of the respective endless belts 26. The presence of the wafer W in the entrance 27 is detected by an optical detector 38, whereby the drive unit 30 is energized to drive the endless belts 26 so that the semiconductor wafer W inserted into the entrance 27 is moved upward by a distance corresponding to one pitch of the shelves 25. When the second wafer W is brought into the entrance 27, the wafer W is similarly detected and the endless belts 26 are upwardly driven by the one pitch distance. After this step is repeated several times, the first wafer W reaches the exit 28 at the top of the vertical transfer path 29. This presence of the semiconductor wafer W at the exit 28 is detected by a suitable detector such as a laser sensor 39, whereupon the transfer unit 34 is activated so that the suction pad 35 lifts the semiconductor wafer W from the exit 28 and lays it on the air bearing conveyor 33, which conveys the wafer W to an unillustrated station of the next step. Thus, according to the above embodiment, the semiconductor wafers W can be conveyed between two conveyor lines separated from each other in the vertical direction.

Figure 3:
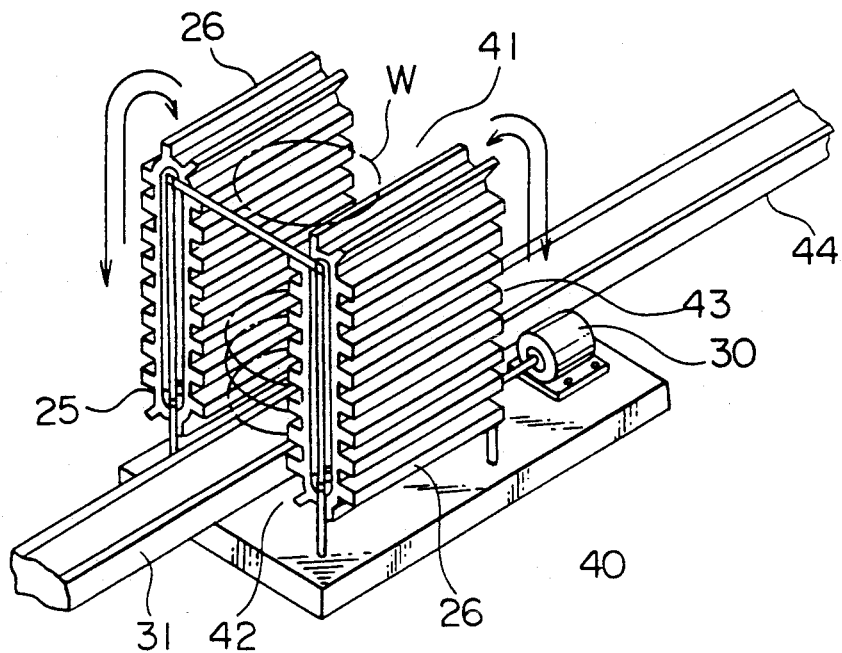
FIG. 3 is a perspective view illustrating another embodiment of an apparatus according to the invention for vertically carrying semiconductor wafers.

FIG. 3 illustrates another embodiment of the vertical wafer conveying apparatus 40 in which the wafers W on the conveyor line can be temporarily stored. In this embodiment, the wafer conveying apparatus 40 comprises a vertical transfer path 41 that is reciprocating. Therefore, an entrance 42 and an exit 43 are at a common bottom end of the vertical transfer path 41 and an exit transfer unit air bearing conveyor 44 extends horizontally from the exit 43 at the lower end of the vertical transfer path 41 to the next station. Two air bearing conveyors 31 and 44 positioned in series may be replaced with a single, continuous air bearing conveyor.

In the above embodiment, the semiconductor wafers conveyed by the air bearing conveyor 31 are successively moved upward within the vertical transfer path by the shelves 25 of the endless belts 26. When the desired number of semiconductor wafers W are stored between the endless belts 26, the operation of the endless belts 26 may be stopped to temporarily stock the wafers W therebetween. When the air bearing conveyors 31 and 44 continue to move wafers even after the endless belts 26 are stopped, the semiconductor wafers W can be continuously supplied to the manufacturing line.

When it is desired to supply the temporarily stored wafers back to the manufacturing line, the endless belts 26 are driven downwardly or opposite to the previous operation. Then, the last stored wafer W is first returned back onto the air bearing conveyors 31 and 44 from which it is fed to the next processing station.

As apparent from the foregoing description, with this embodiment, the vertical wafer conveying apparatus of the present invention can be utilized in various modes in accordance with the manner of operation of the endless belts 26. For example, the apparatus can be selectively used for temporarily storing the semiconductor wafers W, for altering the sequence of supply of the wafers W, or for supplying the semiconductor wafers W in a selective or intermittent manner.

Figure 4:
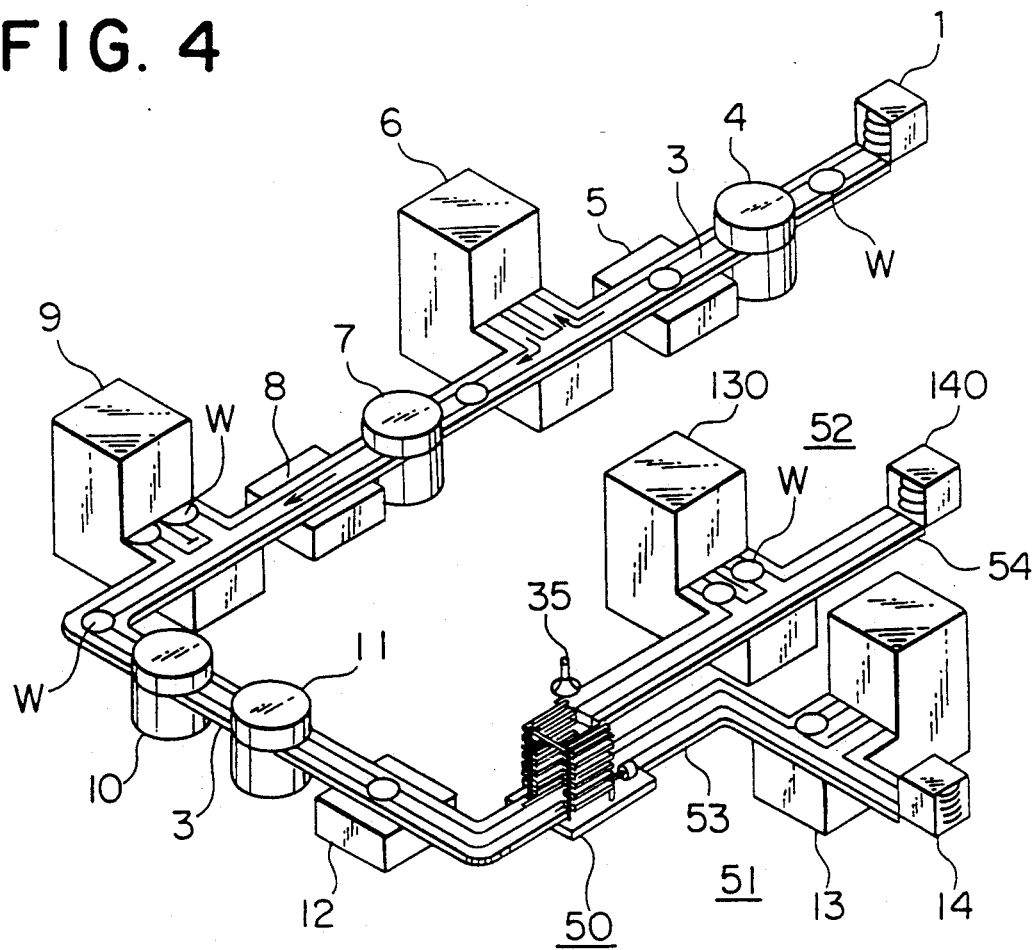
FIG. 4 is a perspective view illustrating still another embodiment of an apparatus according to the invention for vertically carrying semiconductor wafers as incorporated into a semiconductor device manufacturing line.

FIG. 4 illustrates an air bearing conveyor line system for photo-engraving the semiconductor wafers in which a still another embodiment of the vertical wafer carrying apparatus of the present invention is incorporated. In FIG. 4, the semiconductor wafers W successively supplied from the wafer supply cassette 1 are conveyed in the direction of arrows by the air bearing conveyor 3 and subjected to various treatments. In the illustrated example, the semiconductor wafers W are conveyed through the photo-resist coating chamber 4, the prebaking zone 5, the pattern printing machine 6, the developing chamber 7, the post baking zone 8, the resist inspector 9, the photo-etching chamber 10, the photo-resist removal chamber 11 and the dewatering baking zone 12 in the named order and supplied into the vertical wafer conveying apparatus 50 of the present invention. In this example, the vertical wafer conveying apparatus 50 is utilized to selectively supply the semiconductor wafers W into a first line 51 in which the semiconductor wafers W are passed through a first pattern inspector 13 and stored within a first container cassette 14 or into a second line 52 disposed above the first line 51 and in which the semiconductor wafers W are passed through a second pattern inspector 130 and stored within a second container cassette 140.

More particularly, the semiconductor wafer W are supplied from the wafer supply cassette 1 to the line and successively processed in the same manner as in the example illustrated in FIG. 1 and fed to the vertical wafer conveyor apparatus 50. When the required quality control of the semiconductor wafers W is the same for each semiconductor wafer W, the vertical wafer conveyor apparatus 50 of the present invention is not operated to allow the semiconductor wafers W to pass through the apparatus 50 to be supplied to the first line 51, where the semiconductor wafers W are conveyed by the air bearing conveyor 53 to the pattern inspector 13 for inspection and storage within the container cassette 14. when it is required to change the quality control according to the specification of the semiconductor wafer W, at the time when the semiconductor wafer W which is to be supplied to the second line enters the vertical wafer conveying apparatus 50 of the present invention, the endless belts 26 of the vertical wafer conveying apparatus 50 are driven to upwardly convey the wafer W for transferred by the suction pad 35 from the top of the endless belts 26 to the second air bearing conveyor 54 of the second line 52. The semiconductor wafers W thus trsansferred are stored in the container cassette 140 after they are inspected by the second pattern inspector 130 in the same manner as in the case of the first line 51.

When the container cassette 140 of the second line 52 is used as a stocker and the second air bearing conveyor 54 and the endless belts 26 of the vertical wafer conveyor apparatus 50 are operated in the reverse direction. the semiconductor wafers W stored within the second container cassette 140 can be supplied back to the first line 51.

Also, the first and the second container cassettes 14 and 140, respectively, may be respectively replaced by the vertical wafer conveying apparatus of the present invention. If desired, the shelves of the endless belts 26 of the vertical wafer conveying apparatus 50 may be connected at one end to form a comb-shaped pattern defining a plurality of horizontal grooves closed at the connected end.

While the illustrated example uses the first and the second lines 51 and 52, together with the vertical wafer conveyor apparatus 50 of the present invention, one or more lines may equally be utilized. In this case, in order to transfer the semiconductor wafers W to the intermediate lines, a pusher, which can be inserted from the opposite side of the line into the vertical transfer path defined between the endless belts to push out the semiconductor wafers supported on the shelves of the endless belts onto the air bearing conveyor may be included.

As has been described, according to the vertical wafer carrying apparatus of the present invention, the semiconductor wafers supported on the shelves of the endless belts can be moved up and down by driving the endless belts, so that the vertical wafer carrying apparatus is advantageous when incorporated in a semiconductor wafer manufacturing line in that the semiconductor wafers can be temporarily stored in the apparatus, the wafers can be selectively supplied between different manufacturing lines and the wafers can omit a particular process step.

What is claimed is:

1. A vertical wafer carrying apparatus comprising:
   a pair of endless belts, each having a plurality of outward projections forming a plurality of substantially horizontal, parallel shelves;
   support means supporting said pair of endless belts is spaced apart relationship with at least some pairs of said projections on said endless belts facing each other for supporting respective semiconductor wafers on said shelves and defining a substantially vertical transfer path having an entrance and an exit between said endless belts, said endless belts being movable along respective endless loops;
   drive means for driving each of said endless belts along the endless loops at substantially equal speeds in the same direction along the vertical transfer path;
   an entrance conveying unit disposed at the entrance of the vertical transfer path for conveying a semiconductor wafer to the entrance;
   an exit conveying unit disposed at the exit of the vertical transfer path for conveying a semiconductor wafer from the exit;
   an entrance sensor for sensing semiconductor wafer at the entrance of the vertical transfer path and actuating said drive means in response; and
   an exit sensor for sensing a semiconductor wafer at the exit of the vertical transfer path and actuating the exit conveying unit in response.

2. A vertical wafer carrying apparatus as claimed in claim 1 wherein the vertical transfer path has a lower end and an upper end, and one of said entrance and said conveying units is disposed at the upper end and comprises a suction transfer unit including a suction pad for transferring a wafer between the upper end of the transfer path and the conveying unit disposed at the upper end.

3. A vertical wafer carrying apparatus as claimed in claim 1 wherein said drive means comprises a bidirectional drive unit, each of said entrance conveying unit and said exit conveying unit comprises at least one air bearing conveyor, and said bidirectional drive unit and said conveying units are selectively operable.

4. A vertical wafer carryign apparatus as claimed in claim 1 wherein the entrance and exit of the vertical transfer path are co-located between said endless belts and said entrance conveying unit joins said exit conveying unit between the pair of endless belts for conveying a semiconductor wafer to said pair of endless belts for vertical movement of a semiconductor wafer by said shelves and for conveying away from said pair of endless belts a semiconductor wafer placed on said exit conveying unit by said shelves.

5. A vertical wafer carrying apparatus as claimed in claim 2 wherein the other of said entrance and exit conveying units is disposed at the lower end of the vertical transfer path.

* * * * *

UNITED STATES PATENT AND TRADEMARK OFFICE
CERTIFICATE OF CORRECTION

PATENT NO. : 5,113,992
DATED : May 19, 1992
INVENTOR(S) : Masaaki Sadamori

It is certified that error appears in the above-identified patent and that said Letters Patent is hereby corrected as shown below:

Column 6, claim 1, line 8, change "is" to --in--.

Column 6, claim 2, line 34, after "said" (second occurrence) insert --exit--.

Column 6, claim 4, line 46, change "carryign" to --carrying--.

Signed and Sealed this

Seventeenth Day of August, 1993

*Attest:*

BRUCE LEHMAN

*Attesting Officer*     Commissioner of Patents and Trademarks